United States Patent [19]

Pribat et al.

[11] Patent Number: 5,360,754
[45] Date of Patent: Nov. 1, 1994

[54] METHOD FOR THE MAKING HETEROEPITAXIAL THIN LAYERS AND ELECTRONIC DEVICES

[75] Inventors: Didier Pribat, Sevres; Bruno Gerard, Chelles, both of France

[73] Assignee: Thomson-CSF, Puteaux, France

[21] Appl. No.: 41,455

[22] Filed: Apr. 2, 1993

[30] Foreign Application Priority Data

Apr. 2, 1992 [FR] France ................. 92 04001

[51] Int. Cl.$^5$ ............................ H01L 21/20
[52] U.S. Cl. ........................... 437/89; 437/83; 437/84; 437/90; 437/133; 437/105; 437/107; 437/126; 437/129
[58] Field of Search ............ 437/89, 90, 83, 84, 437/132, 126, 129, 133, 105, 107

[56] References Cited

U.S. PATENT DOCUMENTS

| | | | |
|---|---|---|---|
| 4,897,367 | 1/1990 | Ogasawara | 437/132 |
| 4,910,154 | 3/1990 | Zanio et al. | 437/126 |
| 4,927,204 | 6/1990 | Ishibashi et al. | 437/107 |
| 4,940,672 | 7/1990 | Zavracky | 437/132 |
| 4,952,586 | 8/1990 | Pribat et al. | 437/90 |
| 4,999,314 | 3/1991 | Pribat et al. | 437/89 |
| 5,106,778 | 4/1992 | Hollis et al. | 437/84 |
| 5,185,286 | 2/1993 | Eguchi | 437/89 |
| 5,194,399 | 3/1993 | Takahashi et al. | 437/90 |

FOREIGN PATENT DOCUMENTS

| | | | |
|---|---|---|---|
| 0250171 | 12/1987 | European Pat. Off. | 437/126 |
| 0390661 | 10/1990 | European Pat. Off. | |
| 2629637 | 10/1989 | France | |
| 2667617 | 4/1992 | France | |
| 4125920 | 4/1992 | Japan | 437/89 |
| 8102948 | 10/1981 | WIPO | 437/89 |

OTHER PUBLICATIONS

Appl. phys. Letts. 57(12), Sep. 17, 1990, pp. 1209–1211, Fukui et al. "Lateral quantum well wires fabricated by selective metalorganic chemical vapor deposition".
Japanese journal of applied physics/part 2: letters, vol. 26(10), Oct. 1987. pp. L1587–L1589, Seki et al., "Mocvd growth of InP on 4 inch Si substrate with GaAS intermediate layer".

Primary Examiner—Robert Kunemund
Assistant Examiner—Ramamohan Rao Paladugu
Attorney, Agent, or Firm—Oblon, Spivak, McClelland, Maier & Neustadt

[57] ABSTRACT

The disclosure relates to the field of monocrystalline thin layers deposited on a substrate having an identical or a different nature, from a vapor phase. On the substrate made of monocrystalline material A, a cavity is built, determined by one face of the substrate and one face of a layer made of a material D in such a way that there can be neither nucleation nor growth on the faces exposed to the vapor phase. The growth is done from a seed made of monocrystalline material B located between two faces of the substrate and of the layer. The seed made of monocrystalline material B may be of a nature different from that of the substrate (for example, substrate=silicon and material B=GaAs) and is made, for example, by MBE or MOCVD. The material C to be made to grow is different from the material B of the seed. The material C is, for example, InP and the growth is done by VPE.

15 Claims, 9 Drawing Sheets

METHOD FOR THE MAKING HETEROEPITAXIAL THIN LAYERS AND ELECTRONIC DEVICES

BACKGROUND OF THE INVENTION

1. Field of the Invention

The invention relates to a method for the making of heteroepitaxial thin layers and, more specifically, for the making of layers of different types of semiconductor materials. The invention also relates to the application of this method to the making of electronic and optoelectronic devices.

The invention can be used to obtain thin layers with a low density of defects, on a substrate that is also monocrystalline and that, in principle, has a distinct nature, by using seeds of a third material.

For example, the method according to the invention can be used to obtain thin layers of InP of high crystalline quality on a silicon substrate, using GaAs seeds. Furthermore, the method according to the invention can be used to obtain particular structures and associations of components (lasers, photodiodes, gun diodes etc.) based on III-V type material on a silicon substrate.

2. Description of the Prior Art

The heteroepitaxial growth of thin layers of III-V type compounds of high crystallographic quality on a silicon substrate enables the association of semiconductors having direct gaps and high mobility with a material that is technologically well mastered.

The result thereof is an extremely vast range of applications, in fields such as integrated optoelectronics (lasers and photodiodes with associated commands), optical telecommunications, power components made of III-V type materials, optical connection systems on silicon chips etc.

From a technical point of view, the growth of III-V type components on silicon is done by MBE (Molecular Beam Epitaxy) or MOVPE (Metalorganic Vapor Phase Epitaxy), which gives epitaxially grown thin layers having densities of dislocations greater than $10^6/cm^2$ (cf. S. F. Fang et al. in J. Appl. Phys., 68, R31-190), with which it is impossible to make optical components (such as lasers and photodiodes) having acceptable longevity.

Furthermore, while the epitaxy of GaAs on Si by MBE or MOVPE is relatively controlled, that of InP is very difficult to implement, for nucleation on Si takes place only at low temperature.

Consequently, it is difficult to decompose phosphine ($PH_3$) when working with "source gas" MBE or else phosphine and metalorganics (trimethyl and triethylindium) when using MOVPE or MOMBE (Metalorganic Molecular Beam Epitaxy). Finally, the use of phosphorus at low temperature in standard MBE raises problems of pumping. In all cases, the InP layers show dislocation levels of over $10^6/cm^2$ as indicated here above.

The French patent applications Nos. 88 04437 and 88 04438 describe methods of growth that enable notable improvements in the quality of the heteroepitaxial layers of III-V materials on a silicon substrate.

Improvements to these methods have been described in the patent applications Nos. 90 12443 and 91 12352.

In the different documents referred to here above, the heteroepitaxy related to a material B (for example GaAs) on a substrate A (for example Si).

The present invention relates to a method for obtaining a material C that is monocrystalline and without defects (for example InP) from seeds of a material B (for example GaAs) on a substrate of a material A (for example silicon).

Taking the examples of materials indicated here above, the invention enables a "directed" growth of InP with high crystallographic quality on silicon, using very poor quality GaAs seeds. Furthermore, the step of direct growth (MBE or MOVPE) of InP on Si, which is very difficult to implement, is eliminated.

SUMMARY OF THE INVENTION

The invention therefore relates to a method for the growing of heteroepitaxial thin layers, said method comprising the following steps:

the making of a seed of monocrystalline material of a first type (B) in a cavity, the walls of which are made of at least one material on which there can be neither nucleation nor growth during the epitaxy step that will follow;

the growth, by epitaxy, of a material of a second type (C) in the cavity, from the seed so as to obtain a monocrystalline material of the second type (C) in the cavity.

The invention also relates to a method for the growth of heteroepitaxial thin layers, comprising the following steps:

the growth, on a face of a crystalline substrate, of a layer of a monocrystalline material of the first type (B);

the deposition of an insulator layer;

the making of at least one first aperture in the insulator layer;

the etching, through the first aperture, of a part of the layer of the first type (B) of monocrystalline material along a sufficient length from the edges of the aperture for the making of a seed;

the growth of a seed, made of a material of the second type (C), through the aperture from the material of the first type (B);

the making of at least one second aperture in the insulator layer, above the material of the first type (B);

the etching, through the second aperture, of the material of the first type (B);

the growth, by epitaxy, of a material of the second type (C) by the second aperture, starting from the seed made of material of the second type (C)

BRIEF DESCRIPTION OF THE DRAWINGS

The different objects and features of the invention shall appear more clearly from the following description, and from the appended drawings, of which.

MORE DETAILED DESCRIPTION

Figure 1:
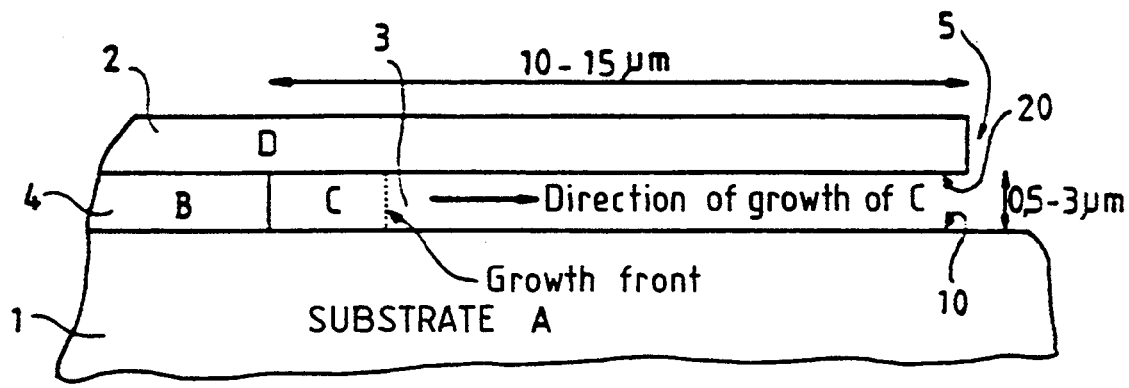
FIG. 1 shows a general view of the manufacturing method of the invention.

Referring to FIG. 1, we shall first of all give a general description of the method of the invention.

On a substrate 1, made of a monocrystalline material A, there is made a seed 4, of a material B that is also monocrystalline, sandwiched between a face 10 of the substrate 1 and a face 20 of a confinement element (layer) 2 made of a material D.

Through an aperture 5, a monocrystalline material C is made to grow in the cavity 3 from the seed 4. The growth front of the monocrystalline material C develops as indicated by an arrow in FIG. 1. As shall be seen here below, a preferred method of growth will be a chloride or hydride vapor phase epitaxy (VPE).

According to the invention, the material C to be made to grow is of a type different from the material B of the seed 4.

As for the materials A and D, they may have chemically different or similar natures, but they are chosen so that, during the growth of the material C, there can be neither nucleation nor growth of the material C on the faces 10 and 20 under the chosen conditions of growth.

According to the exemplary embodiments that shall be described here below, the materials A and B are different. However, it is also possible to envisage a case where they are identical.

For example, the material A of the substrate 1 is silicon, the material B of the seed 4 is GaAs and the material C to be grown is InP.

Figure 2A:
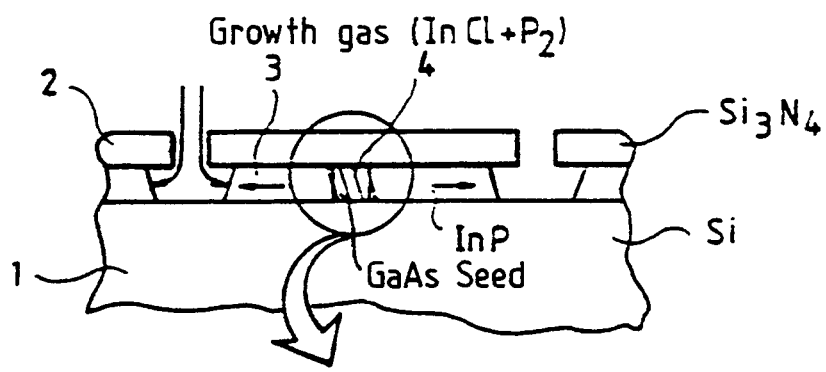
FIGS. 2a and 2b show explanatory diagrams of the method of the invention.
Figure 2B:
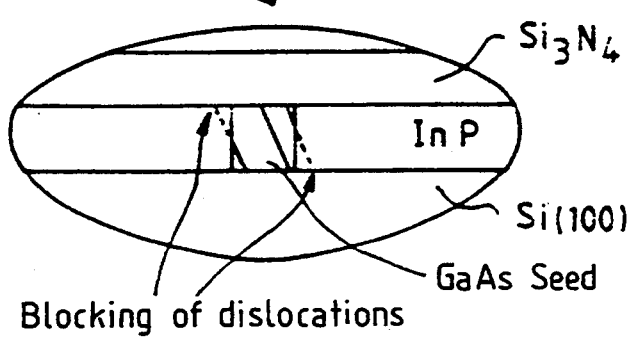

The method of the invention consists in achieving the growth, by directed epitaxy on silicon, of the material such as, for example, InP from the GaAs seed. The blocking of the GaAs dislocations generated at the GaAs/InP interface during the epitaxial operation is done either at the face 20 of the element 2, positioned beforehand above the GaAs seed. FIGS. 2a and 2b give a schematic view of the principle of this blocking of the dislocations (the dislocations being shown in the form of inclined lines).

In order to prevent parasitic nucleation and easily obtain conditions of selective epitaxy, the element 2 is constituted by a typically dielectric material, with a high nucleation barrier. Furthermore, the nucleation on the surface 10 of the silicon is also prevented, here again because of the intrinsically high value of the barrier of nucleation of InP on Si but also because this surface 10 is partially passivated by native oxide. The method preferably used for this type of growth will be one that enables operation close to conditions of thermal equilibrium for the total reaction of deposition, namely a method of chloride VPE (vapor phase epitaxy) or else hydride VPE (HVPE). In the former case, the precursors are phosphorus trichloride ($PCl_3$) and indium, while in the latter case the precursors are phosphine ($PH_3$) and indium.

FIGS. 3a to 3d give a succinct description of a succession of technological steps of the method according to the invention, making it possible to obtain thin layers of InP on Si using GaAs seeds on silicon.

Figure 3A:
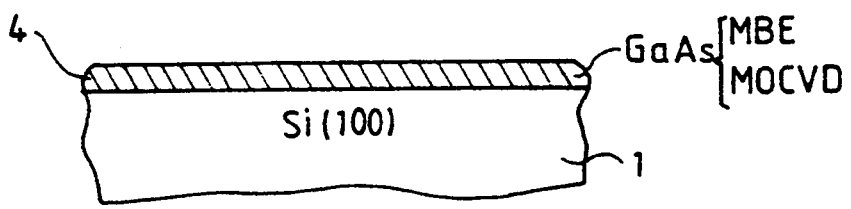
FIGS. 3a to 3d shows manufacturing steps of the method according to the invention.
Figure 3B:
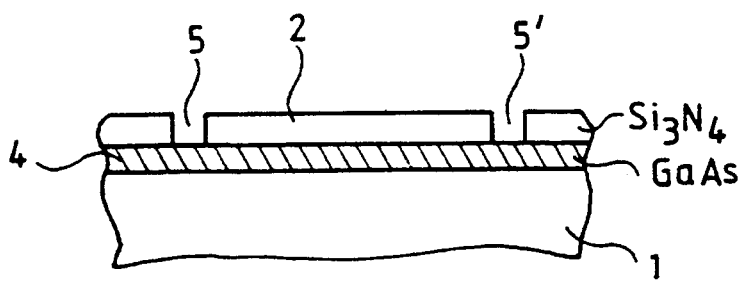
Figure 3C:
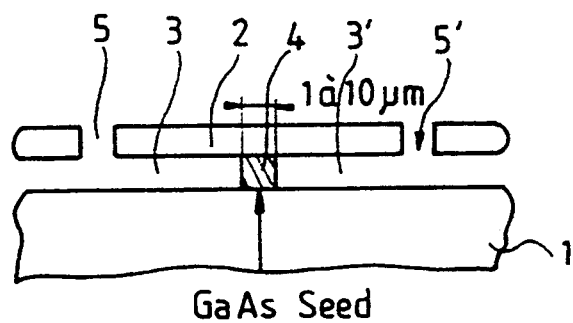
Figure 3D:
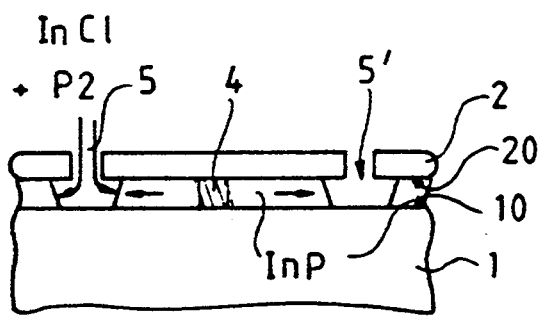

The procedure starts with a GaAs layer 4 on a silicon substrate 1 obtained by MBE or by MOCVD and having a density of dislocations typically greater than $10^6/cm^2$ (FIG. 3a). A deposition is made, on this structure, of a thin layer of $Si_3N_4$ or any other appropriate material in which there are made apertures 5, 5' such as parallel bands with a width of 1 to 20 $\mu m$ and with a pitch or spacing of 10 to 200 $\mu m$ (FIG. 3b). The major part of the GaAs is removed from the layer 4 (either chemically or in vapor phase at 600°-800° C., using hydrochloric acid HCl) through the previously etched apertures 5, 5' so as to keep only the bands 4, having a width of 1 to 10 $\mu m$ for example (FIG. 3c): these bands 4 will serve as seeds. The InP is then epitaxiated through the apertures 5, 5'. Starting from the lateral seeds of GaAs such as 4, the growth is achieved in a confined way in the cavities 3, 3' between the lower surface 20 of the cap 2 and the upper surface 10 of the silicon wafer (FIG. 3d). Owing to this confinement, the dislocations are blocked according to the mechanism of FIGS. 2a and 2b. Thus, defect-free InP on silicon is obtained.

Although the dislocations are blocked, it may happen that, should the lattice parameter mismatching and/or the difference in thermal expansion coefficients be too great, cracks will appear in the material obtained by directed growth (InP in the above example) beyond a certain width of growth.

In order to overcome this drawback, the invention provides for a two-step procedure for directed growth, as is shown schematically in FIGS. 4a to 4f.

Figure 4A:
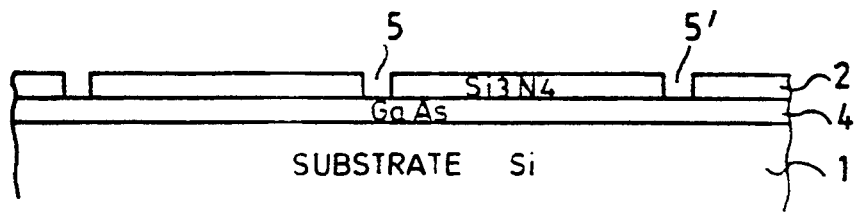
FIGS. 4a to 4f show an example, in detail, of a method of manufacture according to the invention.
Figure 4B:
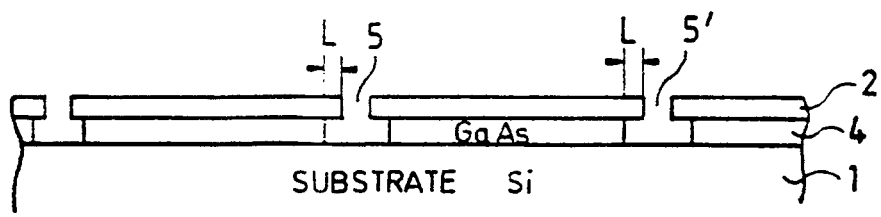
Figure 4C:
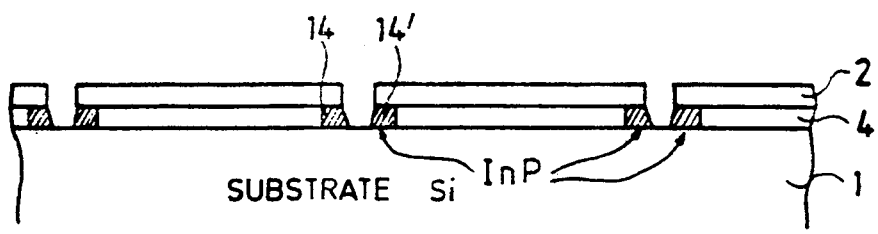

Just as in the foregoing procedure, a layer 2 of nitride, $Si_3N_4$ for example, is deposited on a layer 4 of GaAs heteroepitaxiated (by MBE or MOCVD) on a silicon substrate 1. Apertures 5, 5', in the form of bands for example, are opened in this nitride layer (FIG. 4a). For the different geometrical characteristics, reference will be made to the commentary on FIG. 3b. Through the apertures 5, 5' thus made, the GaAs layer 4 is very slightly etched so as to clear a width L, starting from the edges of the bands 5, 5', that is smaller than the critical width beyond which cracks are liable to appear during the re-epitaxy of the third material (InP in the chosen example). Typically, this clearing is of the order of 0.5 to some micrometers (see FIG. 4b). Then a first growth (of InP according to the chosen example) is made, starting from the lateral flanks of GaAs left bare after the etching operation. The width of this growth is kept below the critical width corresponding to the appearance of the cracks (FIG. 4c). New seeds 14, 14', etc., made of InP, are obtained.

Figure 4D:
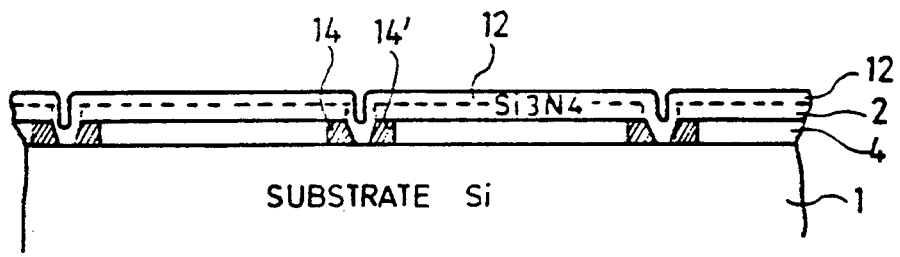

A second layer of $Si_3N_4$ is re-deposited on the entire piece, so as to block the previously etched apertures (FIG. 4d).

Figure 4E:
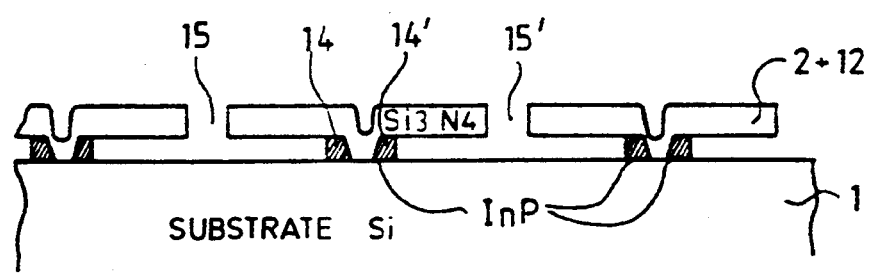
Figure 4F:
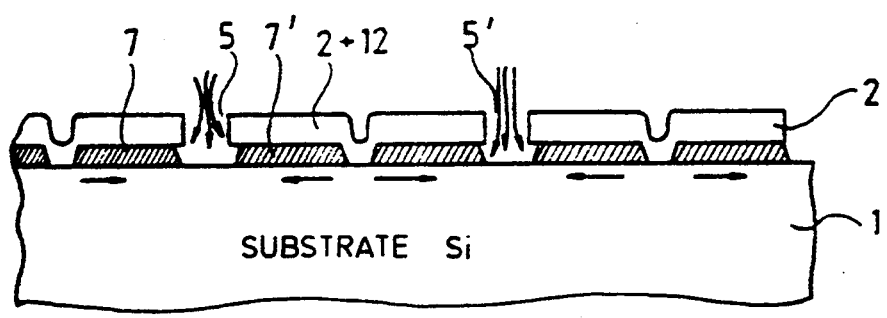

Using a second mask (or else the same mask as the one used to make the first apertures, but translated by a half-pitch), a second series of bands 15, 15' is opened in the nitride layers (see FIG. 4e). This second series of bands is preferably positioned midway between the previous bands 5, 5' etc. Through these second apertures, the remaining layer 4 of GaAs is eliminated by chemical etching so as to keep only the new seeds 14, 14' of InP (again according to the chosen example). For this etching, preferably a selective chemical mixture is used, in such a way that there is no need to control the etching of the InP. This latter operation could indeed prove to be extremely difficult, should the InP bands have a small width. The structure thus obtained is shown in FIG. 4e. Finally, the seeds 14, 14' etc. are used for the re-growing, by directed epitaxy, of the layers 7, 7' etc. of InP without defects on a silicon substrate (see FIG. 4f).

For different reasons, and depending on the nature of the components that are to be made in the layers of III-V materials on silicon, it may be desired to insulate the thin layer from the substrate.

In this case, the invention provides for a chemical oxidation of the surface of the silicon substrate 1, after etching of the layer 4 of material B (GaAs in this case) and before growth by directed epitaxy of the material C (InP). To make this chemical oxide on the surface 10 of the silicon substrate, it is possible to use a solution of $H_2O_2/H_2SO_4$ or else, again, a solution of $HNO_3$. Depending on the period of exposure and on the concentration of the solutions in question, the thicknesses obtained for the "chemical" $SiO_2$ layer 8 will range from some tens to some hundreds of angstroms.

Figure 5:
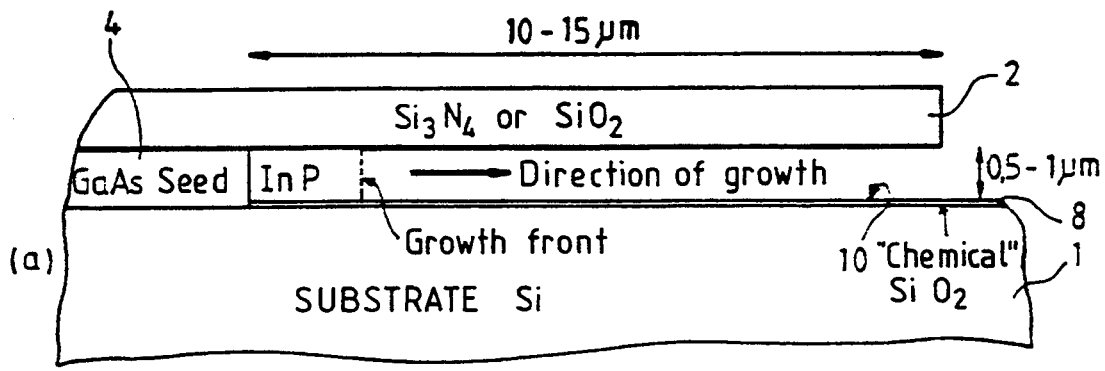
FIG. 5 show a variant of the method of manufacture according to the invention.

FIG. 5 shows a method such as this for growth after chemical oxidation of the face 10 of the substrate 1.

Should a layer 8 of higher quality oxide, or even a thermal oxide, have to be obtained on the surface of the silicon substrate, then the initial substrate used will be a wafer of SOI (silicon on insulator) type silicon. Different techniques are commonly used to make SOI wafers, and the IEEE CIRCUITS AND DEVICES MAGAZINE, Vol 3, Nos. 4 and 6, July and November 1987, for example, may be referred to for many details of these techniques.

In the following example, a SIMOX (Separation by IMplantation of Oxygen) type SOI wafer is used, but it would have been possible also to use SOI wafers of the (Silicon Direct Bonding) or ZMR (Zone Melting Recrystallization) type.

FIGS. 6a to 6f describe a sequence of technological steps by which it is possible to obtain thin layers insulated from the substrate by a high quality oxide.

Figure 6A:
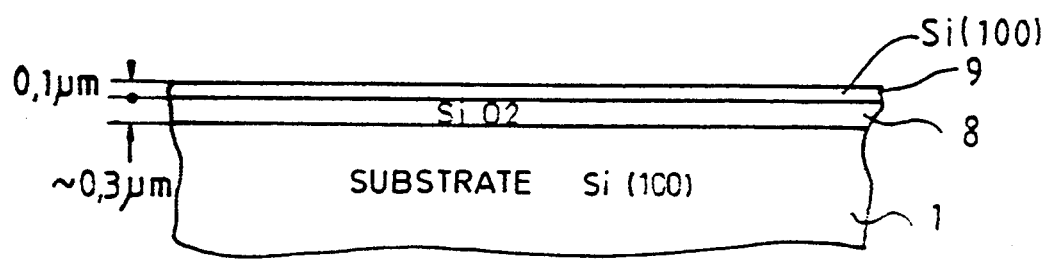
FIGS. 6a to 6f show another example, in detail, of the method of manufacture according to the invention.
Figure 6B:
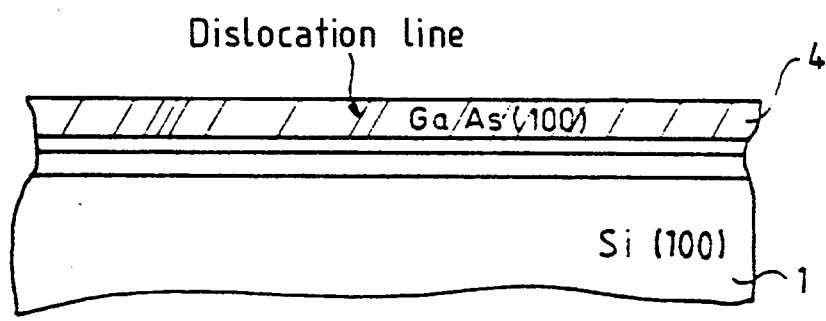
Figure 6C:
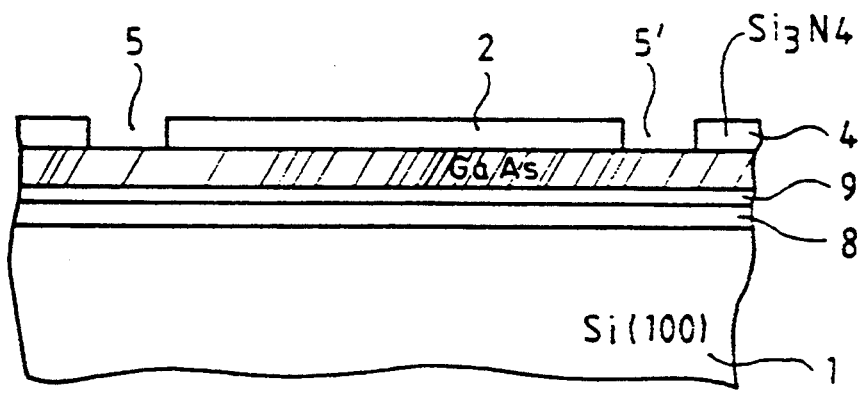
Figure 6D:
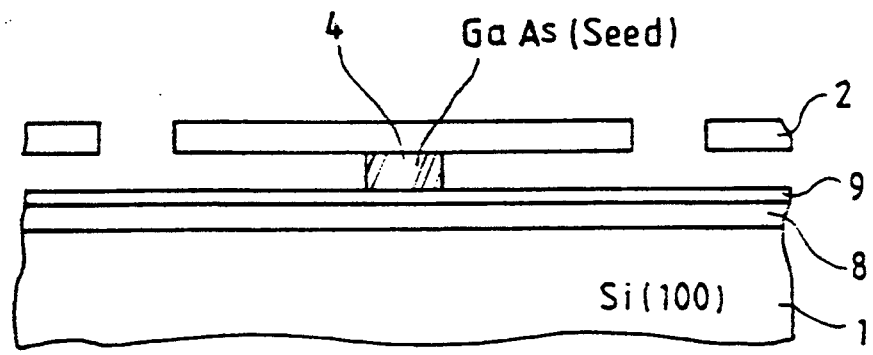

The procedure therefore starts from a SIMOX type wafer comprising a layer 8 of $SiO_2$ and a layer 9 of Si (100) (FIG. 6a) on which there is epitaxially grown, by MBE or MOVPE, a thin layer 4 of GaAs (FIG. 6b), which will therefore have more than $10^6$ dislocations/$cm^2$. A layer 2 of $Si_3N_4$ is deposited. In this layer 2, just as in the foregoing example, a series of apertures 5, 5' is made in the form of parallel bands for example (FIG. 6c). In succession, the GaAs layer 4 is etched to form seeds 4 (see FIG. 6d) and then the silicon layer 9 is etched (see FIG. 6e). Then the directed growth of InP is achieved through the apertures 5, 5' from GaAs seeds. Just as in the case of FIG. 1, there is no nucleation of InP on the flanks of the underlying Si (layer 9) in the form of a GaAs seed if the directed growth of InP is done by VPE for example.

FIGS. 7a to 7d show a variant of a method for making a seed of material B at an end of a cavity surrounded by insulator material, including a thermal oxide.

Figure 7A:
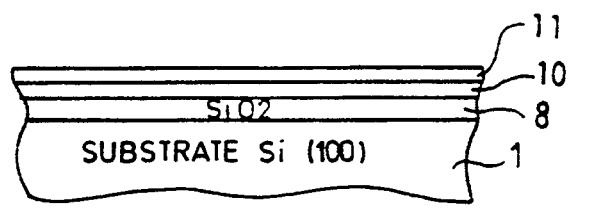
FIGS. 7a to 7d show a variant of the method described with reference to FIGS. 6a to 6f.

According to FIG. 7a, on a substrate 1 made of silicon for example, there is made a layer 8 of thermal oxide (thermal $SiO_2$), then a layer 10 of amorphous semiconductor (amorphous Si) and finally a layer 11 made of a material different from the two previous materials (8 and 10), for example a metal such as aluminum.

Apertures are etched in all these layers: an epitaxy is made of a material (GaAs) in order to make seeds 4. The GaAs material deposited in the apertures on the substrate Si is monocrystalline at 4 and it is polycrystalline on the aluminum layer 11.

Figure 7B:
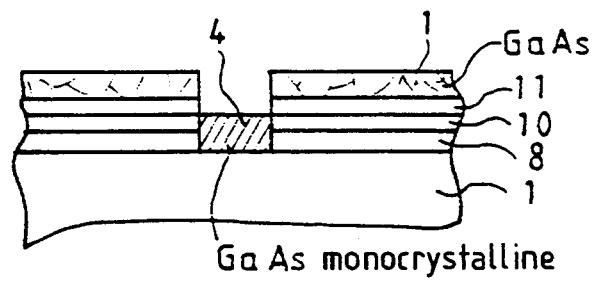

The epitaxy is such that the thickness of the seeds 4 enables the upper face of the layer 10 to be reached (FIG. 7b).

Figure 7C:
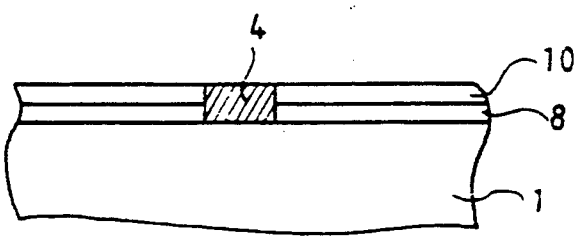
Figure 7D:
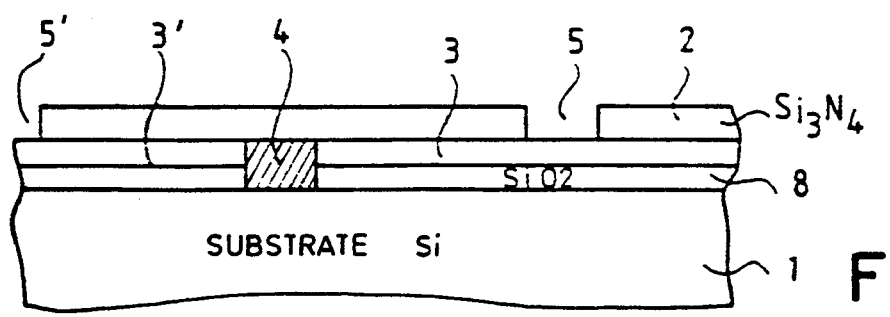

Then, the aluminum layer 11 is etched so as to achieve the "lift off" of the layer 13 of polycrystalline GaAs (FIG. 7c).

The structure is covered by a layer 2 of insulator ($Si_3N_4$) and apertures 5, 5' are made in the layer 2. Through the apertures 5, 5', the amorphous silicon 10 is etched and cavities 3, 3' (FIG. 7d) are obtained.

It is now possible to achieve a directed epitaxy of InP through the apertures 5, 5' out of seeds such as 4, and then a layer of InP on thermal silica 8 is obtained.

The different methods of insulation described here above are necessary when components are made by directed epitaxy on silicon. Thus, FIGS. 8a to 8c give a description, by way of an example, of the making of an InP/GaInAsP/InP laser obtained by directed epitaxy, but by modulating the doping and the composition of the materials epitaxially grown in the cavity 3 of FIG. 8a.

Figure 6E:
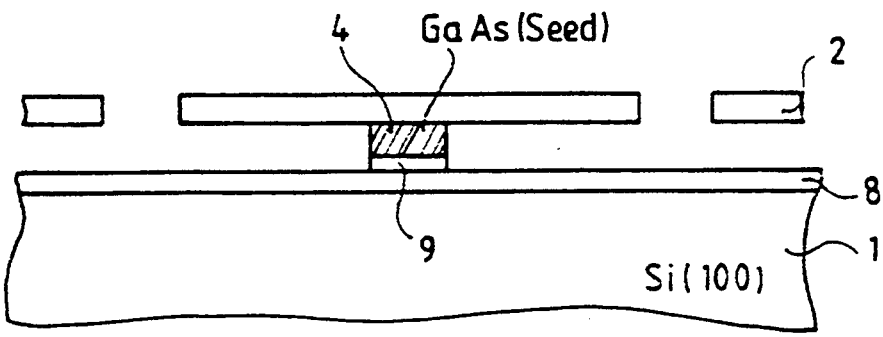
Figure 6F:
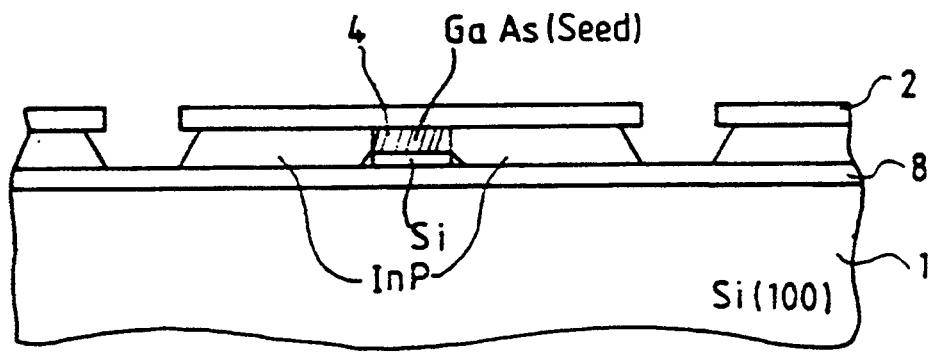
Figure 8A:
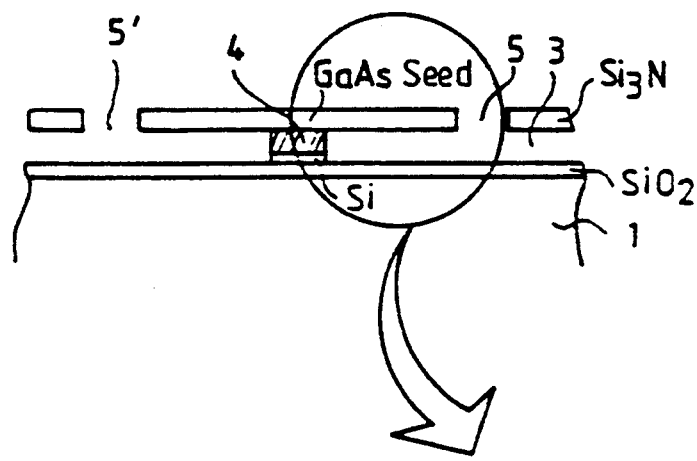
FIGS. 8a to 8c show a method for the manufacture of an optoelectronic device.
Figure 8B:
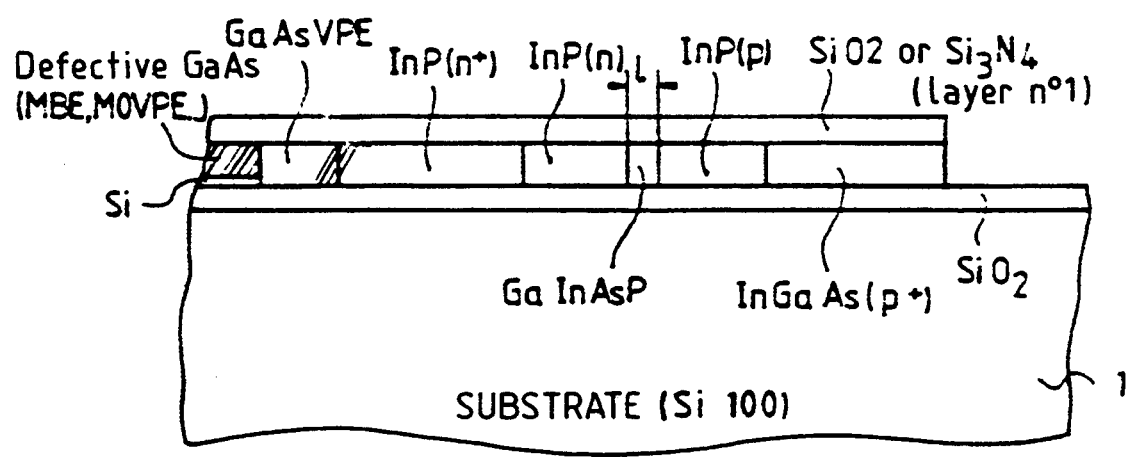
Figure 8C:
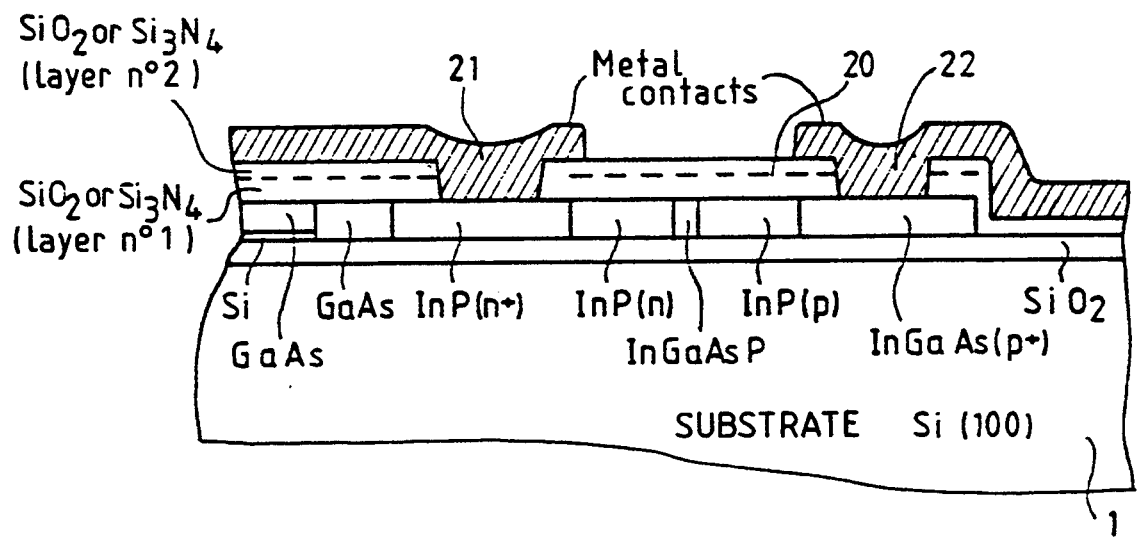

The method starts, for example, with a structure of the type shown in FIG. 6e and carried over to FIG. 8a. It is possible to start, for example, by causing the growth, by VPE, of a layer of GaAs, using the seed 4, so as to improve the crystalline quality of the seed; in most cases, this is not necessary. The bands 5 and 5' in the nitride 2 will preferably have been oriented beforehand in a direction [110] of the plane of the substrate (with an orientation of [100]). The bands of seed 4 keep this orientation [110]. This makes it possible, during the directed growth, to obtain a single lateral facet. Thus, a homogeneous incorporation of the dopants is achieved, during the directed growth. FIG. 8b shows a case where a [110] type lateral growth facet is obtained. After the growth of GaAs, an n+ doped InP growth is achieved, followed by an n doped InP growth. An epitaxy of the quaternary material $Ga_xIn_{1-x}As_yP_{1-y}$ is then done, the lattice parameter of this quaternary material being matched with InP. Depending on the laser wavelength to be obtained, values will be chosen such that, for example, x=0.27 and y=0.60 or else x=0.40 and y=0.85 or else again x=0.47 and y=1.

The width 1 of the quaternary material will typically range from 0.1 to 0.8 μm.

Finally, a growth of InP (p) is carried out, followed by a growth of InGaAs (p+) on which it will be easy to make an ohmic contact. The succession of the layers thus made is shown in FIG. 8b. Finally, a layer 20 of $Si_3N_4$ or of $SiO_2$ is deposited on the structure to passivate it. Windows are opened for the contacts 21, 22. The contacts 21, 22 are deposited and they are etched. FIG. 8c shows the structure of a laser with coplanar electrodes thus obtained.

Figure 9:
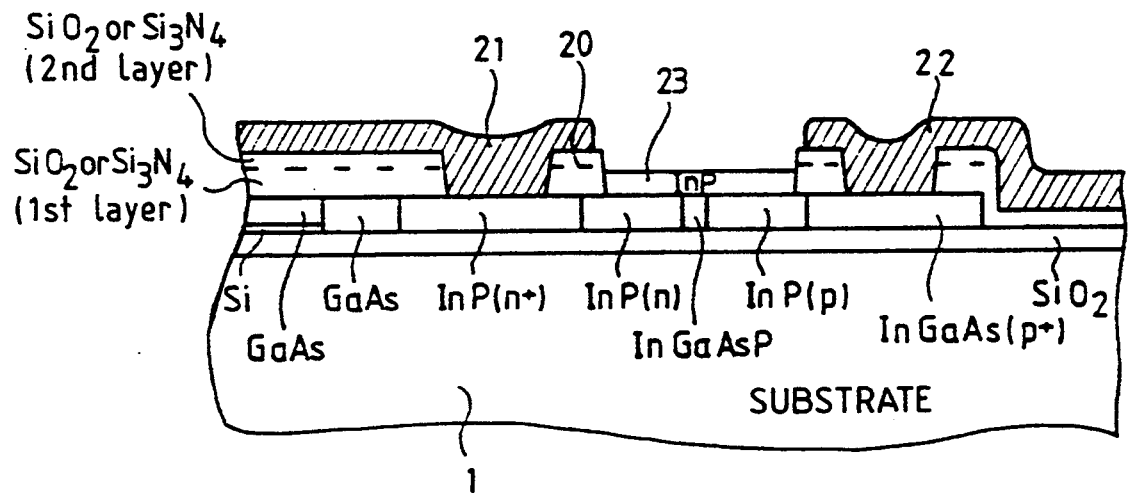
FIG. 9 shows a variant of the method represented by FIGS. 8a to 8b.

In order to improve the upper interface of the active layer of GaInAsP, it is possible, as shown in FIG. 9, to etch the layer 20 of $Si_3N_4$ locally and to carry out a growth, by operations of selective epitaxy, of an InP layer 23 that is either semi-insulating or doped. Thus, an excessive recombination is avoided at the upper interface of GaInAsP: such an excessive recombination would have had the effect of reducing the longevity of the laser.

Figure 10A:
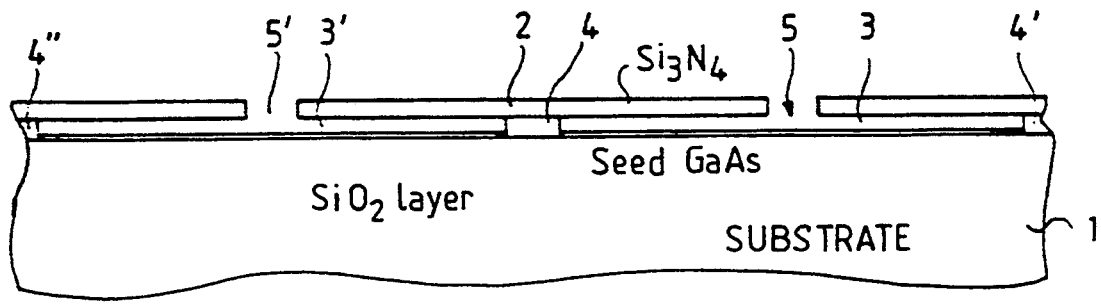
FIGS. 10 to 10c show a method for the manufacture of several associated devices.

On a single substrate, it is possible to fabricate components of different types. Indeed, on the substrate 1 of FIG. 10a, there are shown, for example, two cavities 3 and 3' with seeds 4, 4', 4". The cavity 3 can be used to make one or two components of a first type by the performing an epitaxial growth from the seeds 4, 4'. The cavity 3' can be used to make one or two components of a second type. To this end, it is sufficient to achieve the growth of materials having different compositions and-/or dopings in the two cavities.

Figure 10B:
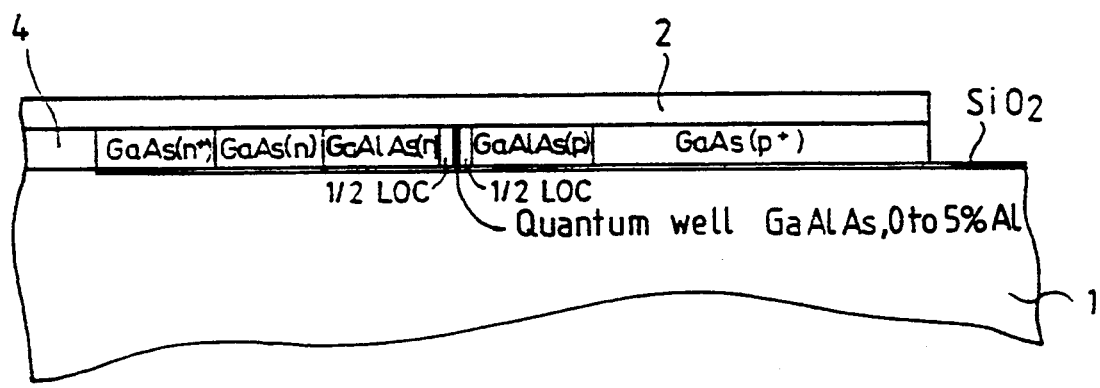
Figure 10C:
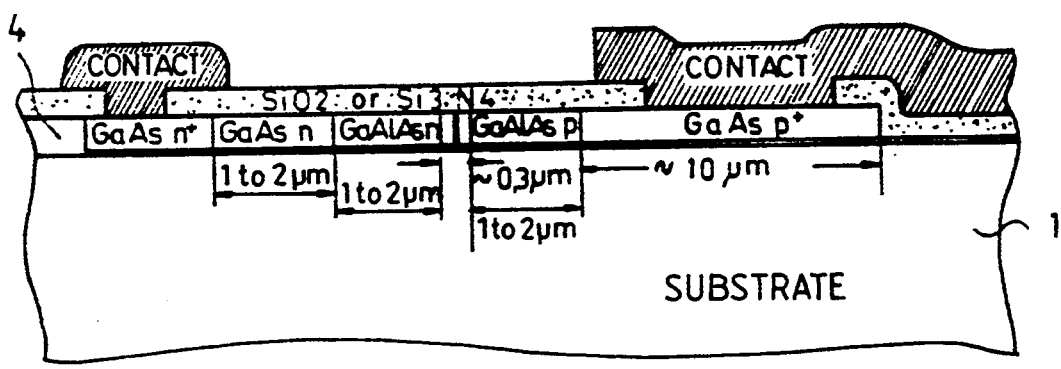

For example if a structure such as the one described here above with reference to FIGS. 8a to 8c is made to grow in the cavity 3, it is clear that, on the same substrate of silicon, in the cavity 3', it is possible to manufacture also by an identical process GaAs/GaAlAs type lasers. FIGS. 10b and 10c describe a quantum well structure such as this.

As shown in FIG. 10b, the following materials are made to grow successively from a GaAs seed:

GaAs (n+)
GaAs (n)
GaAlAs (n)
½ optical cavity of GaAlAs with Al varying continually from 20 to 40%
1 quantum well of GaAlAs with Al chosen between 0 and 5
½ optical cavity of GaAlAs with Al varying continually from 20 to 40%
GaAlAs (p)
GaAs (p+)

After the making of an insulator layer on the structure and the making of contacts, there is obtained the structure shown in FIG. 10c wherein dimensions of the different zones of the materials referred to earlier are indicated on an exemplary basis.

If a GaAs/GaAlAs laser such as the one shown in FIG. 10c and an InP/GaInAsP/InP laser such as the one shown in FIG. 8c have to be made on a single substrate, the method will start with the making of the GaAs/GaAlAs structure of FIG. 10b, this structure being made at higher temperature. Then the structure of FIG. 8b, corresponding to the second type of laser, will be made. The metallizations and the etchings corresponding to FIGS. 8c and 10c will be made at the last stage.

It is clear that the above structures and devices represent only particular examples. According to transistor technology, it is also possible to make InP gun diodes, GaInAs type photodiodes or any other types of photodiodes.

What is claimed is:

1. A method for the growing of heteroepitaxial thin layers, said method comprising the steps of:
    making a seed of monocrystalline material of a first type in a cavity, the walls of which are made of at least one material on which there can be neither nucleation nor growth during the epitaxy step that will follow;
    epitaxially growing a second type material in the cavity, from the seed so as to obtain a monocrystalline material of the second type in the cavity.

2. A method according to claim 1, wherein the step of making the seed in the cavity comprises:
    growing, on a face of a monocrystalline substrate, a layer of monocrystalline material of the first type;
    depositing an insulator layer on said layer of monocrystalline material of the first type;
    forming at least one aperture in the insulator layer;
    etching the layer of monocrystalline material of the first type through the aperture so as to leave only a portion of the layer of monocrystalline material of the first type on said face of said monocrystalline substrate, thereby leaving said seed.

3. A method according to claim 1, wherein the material of one of the walls of the cavity is silicon, the material of the other wall of the cavity is an insulator such as a silicon nitride or silica, the material of the first type is GaAs, and the material of the second type is InP.

4. A method according to claim 1, wherein the growth of the material of the second type is done by vapor phase epitaxy using the seed.

5. A method according to claim 4, wherein the growth is done by chloride vapor phase epitaxy or hydride vapor phase epitaxy.

6. A method for the growth of heteroepitaxial thin layers, comprising the following steps:
    growing, on a face of a crystalline substrate, a layer of monocrystalline material of first type;
    depositing an insulator layer on said layer of monocrystalline material of said first type;
    making at least one first aperture in the insulator layer;
    etching, through the first aperture, a part of the layer of monocrystalline material of the first type, along a length from the edges of the aperture sufficient for the making of a seed;
    growing a seed, made of a material of a second type, through the first aperture, from the material of the first type;
    making at least one second aperture in the insulator layer, above the material of the first type;
    etching, through the second aperture, of the material of the first type;
    growing, by epitaxy, of a material of the second type through the second aperture, starting from the seed made of material of the second type.

7. A method according to claim 6, further comprising the step of depositing another insulator layer, prior to forming said second aperture, or said insulator layer deposited on said monocrystalline material of said first type.

8. A method according to either of claims 1 or 6 comprising the step of oxidizing the face of the substrate prior to the step of epitaxially growing the material of the second type.

9. A method according to claim 1, wherein the two walls of said cavity are made of an insulator material.

10. A method according to one of claims 2 and 6, wherein the substrate is made of monocrystalline silicon and comprises an oxide layer and a layer of monocrystalline silicon that are stacked, and wherein the etching of the layer of monocrystalline material is followed by an etching of the layer of monocrystalline silicon.

11. A method according to claim 1, wherein the step of making the seed in the cavity comprises:
    obtaining, on a monocrystalline semiconductor substrate, an insulator layer, depositing a layer of amorphous semiconductor, and then a layer of a third material that is different from the preceding two materials;
    etching at least one aperture in the layers made, and growing a semiconductor material at least in the aperture starting from the substrate;
    removing the layer of the third material;
    depositing a layer of insulator material;
    making at least one aperture in the insulator layer above the layer of amorphous silicon;
    etching the layer of amorphous semiconductor through the aperture.

12. A method according to either of claims 1 or 6, wherein the growth by epitaxy is done successively with materials having different compositions and/or doping levels.

13. A method according to claim 12, applied to the making of a laser wherein the seed comprises GaAs, and the materials epitaxiated in the cavity are successively the following:
- GaAs;
- InP (n+)
- InP (n)
- InGaAsP
- InP (p)
- InGaAs (p+)

and wherein the structure is covered with an insulator material, ohmic contacts that go through said insulator are made to be connected firstly to the InP (n+) material and secondly to the InGaAs (p+) material.

14. A method according to claim 13 wherein, above the material constituted by InGaAs, the insulator is removed and a layer of InP is deposited in its place.

15. A method according to claim 12, wherein several cavities are made and epitaxial operations with materials of different types and/or dopings are made in different cavities.

* * * * *